US012760441B2

(12) United States Patent
Cong et al.

(10) Patent No.: US 12,760,441 B2
(45) Date of Patent: Oct. 13, 2026

(54) EPI ISOLATION PLATE WITH GAP AND ANGLE ADJUSTMENT FOR PROCESS TUNING

(71) Applicant: Applied Materials, Inc., Santa Clara, CA (US)

(72) Inventors: Zhepeng Cong, San Jose, CA (US); Nimrod Smith, Cupertino, CA (US); Ala Moradian, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 442 days.

(21) Appl. No.: 18/140,013

(22) Filed: Apr. 27, 2023

(65) Prior Publication Data

US 2024/0254654 A1 Aug. 1, 2024

Related U.S. Application Data

(60) Provisional application No. 63/441,394, filed on Jan. 26, 2023.

(51) Int. Cl.
*C23C 16/46* (2006.01)
*C23C 16/455* (2006.01)
(Continued)

(52) U.S. Cl.
CPC ........ *C30B 25/14* (2013.01); *C23C 16/45502* (2013.01); *C23C 16/46* (2013.01); *C30B 25/10* (2013.01); *H10P 72/7624* (2026.01)

(58) Field of Classification Search
CPC ........ C23C 16/45502; C23C 16/45591; C23C 16/46; C30B 25/10; C30B 25/14; H01L 21/68785
See application file for complete search history.

(56) References Cited

U.S. PATENT DOCUMENTS

RE36,957 E 11/2000 Brors et al.
8,038,793 B2 10/2011 Ohnishi
(Continued)

FOREIGN PATENT DOCUMENTS

CN 107665847 A 2/2018
CN 115233303 A 10/2022
(Continued)

OTHER PUBLICATIONS

English computer translation of KR-200343820-Y1 (Year: 2025).*
International Search Report and Written Opinion dated Jan. 23, 2024 for Application No. PCT/US2024/012623.

*Primary Examiner* — Matthew J Song
(74) *Attorney, Agent, or Firm* — Patterson + Sheridan, LLP

(57) ABSTRACT

The present disclosure relates to methods and devices for processing substrates, suitable for use in semiconductor manufacturing. The method includes heating a substrate positioned on a substrate support. The method includes moving an isolation plate adjust one or more of: a height of the isolation plate, or an angle of the isolation plate such that the isolation plate moves to a non-parallel orientation relative to the substrate. The method includes flowing one or more process gases over the substrate to deposit a material on the substrate, the flowing of the one or more process gases over the substrate including guiding the one or more process gases through one or more flow paths defined at least in part by a space between the isolation plate and the substrate.

5 Claims, 12 Drawing Sheets

(51) Int. Cl.

| | |
|---|---|
| ***C30B 25/10*** | (2006.01) |
| ***C30B 25/14*** | (2006.01) |
| ***H10P 72/76*** | (2026.01) |

(56) References Cited

U.S. PATENT DOCUMENTS

| | | | | |
|---|---|---|---|---|
| 8,512,472 | B2 | 8/2013 | Vatus et al. | |
| 2001/0046768 | A1* | 11/2001 | Mezey, Sr. | H01L 21/67109 438/680 |
| 2008/0003784 | A1* | 1/2008 | Pan | H01L 21/02532 438/479 |
| 2016/0068959 | A1 | 3/2016 | Lau et al. | |
| 2023/0407478 | A1 | 12/2023 | Cong et al. | |

FOREIGN PATENT DOCUMENTS

| | | | | |
|---|---|---|---|---|
| KR | 200343820 | Y1 * | 3/2004 | H01L 21/68 |
| KR | 20120007881 | A | 1/2021 | |

* cited by examiner

EPI ISOLATION PLATE WITH GAP AND ANGLE ADJUSTMENT FOR PROCESS TUNING

CROSS-REFERENCE TO RELATED APPLICATIONS

This application claims the benefit of U.S. provisional patent application Ser. No. 63/441,394, filed Jan. 26, 2023, which is herein incorporated by reference in its entirety.

BACKGROUND

Field

The present disclosure relates to a semiconductor processing chamber, and more particularly, to adjustable isolations plates and methods of adjusting an angle and/or a height of an isolation plate within a processing chamber.

Description of the Related Art

Semiconductor substrates are processed for a wide variety of applications, including the fabrication of integrated devices and micro-devices. One method of processing substrates includes depositing a material, such as a dielectric material or a semiconductive material, on an upper surface of the substrate. The material may be deposited in a lateral flow chamber by flowing a process gas parallel to the surface of a substrate positioned on a support, and thermally decomposing the process gas to deposit a material from the gas onto the substrate surface. However, the material deposited on the surface of the substrate is often non-uniform in thickness, and therefore, negatively affects the performance of the final manufactured device.

Therefore, a need exists for improved process chamber components and related methods that facilitate depositing a material that is more uniform in thickness.

SUMMARY

The present disclosure relates to a semiconductor processing chamber, and more particularly, to one or more methods of adjusting an angle and/or a height of an isolation plate within a processing chamber.

In one or more embodiments, a method of processing substrates, suitable for use in semiconductor manufacturing is provided. The method includes heating a substrate positioned on a substrate support. The method includes moving an isolation plate to adjust one or more of: a height of the isolation plate, or an angle of the isolation plate such that the isolation plate moves to a non-parallel orientation relative to the substrate. The method includes flowing one or more process gases over the substrate to deposit a material on the substrate, the flowing of the one or more process gases over the substrate including guiding the one or more process gases through one or more flow paths defined at least in part by a space between the isolation plate and the substrate.

In or more embodiments, a method of processing substrates, suitable for use in semiconductor manufacturing is provided. The method includes heating a substrate positioned on a substrate support. The method includes moving an isolation plate to a non-parallel orientation relative to the substrate, where the isolation plate includes a first end adjacent to a process gas entry point where the moving the isolation plate results in approximately no change in a height of the first end of the isolation plate. The method includes flowing one or more process gases over the substrate, the flowing of the one or more process gases over the substrate including guiding the one or more process gases through one or more flow paths defined at least in part by a space between the isolation plate and the substrate.

In or more embodiments, a flow guide applicable for use in semiconductor manufacturing is provided. The flow guide includes an isolation plate, a mechanical actuator, and an adjustment mechanism coupled to the mechanical actuator. The adjustment mechanism is configured to induce an angular movement in the isolation plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to a semiconductor processing chamber, and more particularly, to one or more methods of adjusting an angle and/or a height of an isolation plate within a processing chamber.

A process chamber design including an isolation plate significantly improves gas flow tuning. The substrate lift position can be utilized to provide small range fine tuning. Additional tuning of isolation plate angle and/or isolation plate height can improve the gas speed for deposition uniformity and gas utilization. Increasing the space between the isolation plate and the substrate may decrease the gas speed, which can result in increased deposition on the substrate. Decreasing the space between the isolation plate and the substrate may increase the gas speed, which can result in decreased deposition on the substrate. A smaller gap between the isolation plate and the substrate support may be utilized during chamber cleaning operations to decrease chamber clean time. A wider gap may be utilized during high temperature substrate processing operations to reduce window coating, extending time between cleaning processes. Other operations may warrant different gaps and isolation plate angles.

Figure 1:
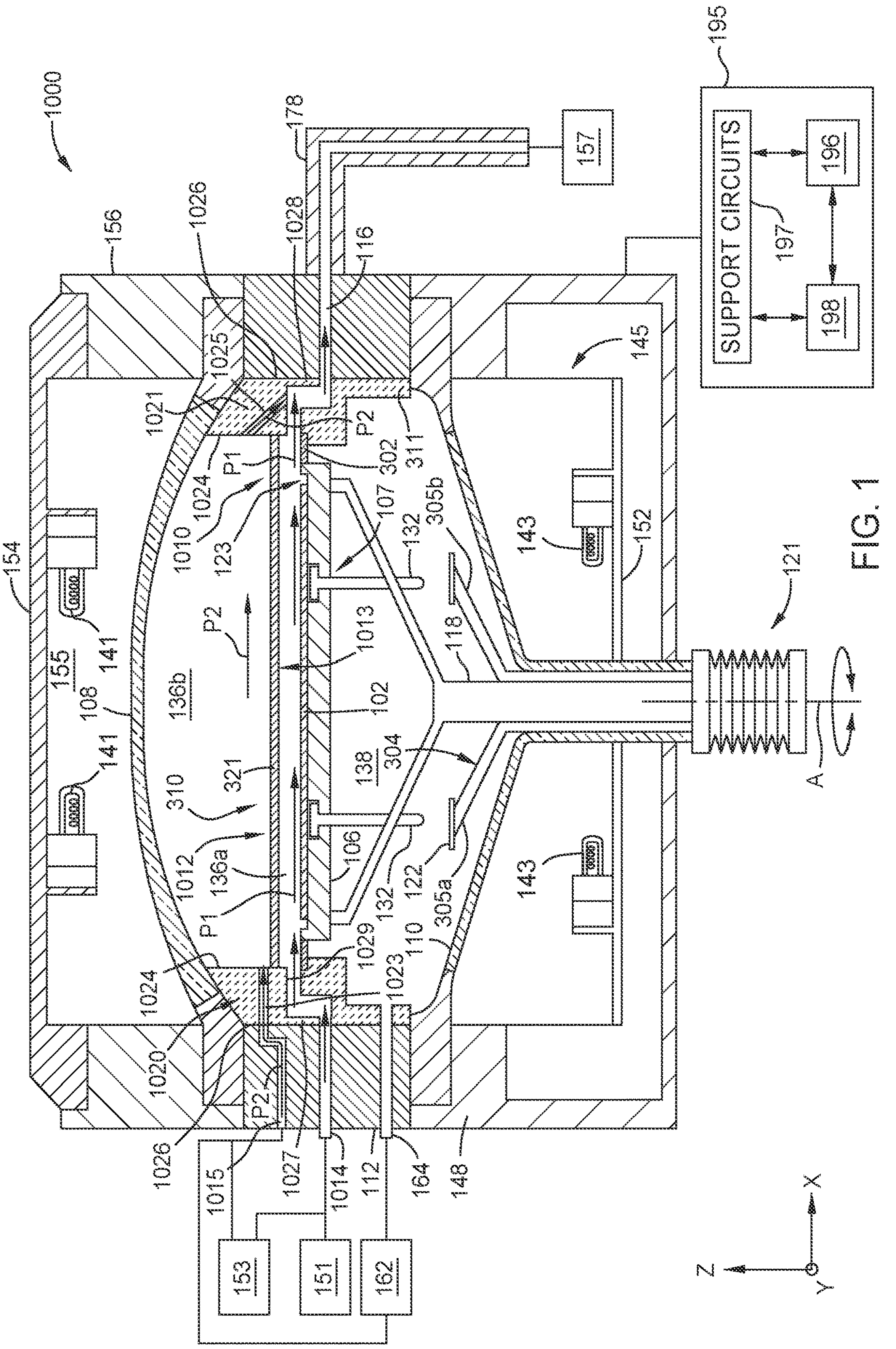
FIG. 1 is a partial schematic side cross-sectional view of a processing chamber, according to one or more embodiments.

FIG. 1 is a partial schematic side cross-sectional view of a processing chamber 1000, according to one or more embodiments. The processing chamber 1000 is a deposition chamber. In one or more embodiments, the processing chamber 1000 is an epitaxial deposition chamber. The processing chamber 1000 is utilized to grow an epitaxial film on a substrate 102. The processing chamber 1000 creates a cross-flow of precursors across a top surface of the substrate 102. The processing chamber 1000 is shown in a processing condition in FIG. 1.

The processing chamber 1000 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper window 108 (such as an upper dome), a lower window 110 (such as a lower dome), a plurality of upper heat sources 141, and a plurality of lower heat sources 143. The present disclosure contemplates that each of the heat sources described herein can include one or more of: lamp(s), resistive heater(s), light emitting diode(s) (LEDs), and/or laser(s). The present disclosure contemplates that other heat sources can be used.

The substrate support 106 is disposed between the upper window 108 and the lower window 110. The substrate support 106 includes a support face 123 that supports the substrate 102. The plurality of upper heat sources 141 are disposed between the upper window and a lid 154. The plurality of upper heat sources 141 form a portion of the upper heat source module 155. The lid 154 may include a plurality of sensors (not shown) disposed therein or thereon for measuring the temperature within the processing chamber 100. The plurality of lower heat sources 143 are disposed between the lower window 110 and a floor 152. The plurality of lower heat sources 143 form a portion of a lower heat source module 145. In one or more embodiments, the upper window 108 is an upper dome and is formed of an energy transmissive material, such as quartz. In one or more embodiments, the lower window 110 is a lower dome and is formed of an energy transmissive material, such as quartz. A pre-heat ring 302 is disposed outwardly of the substrate support 106. The pre-heat ring 302 is supported on a ledge of the lower liner 311. A stop 304 includes a plurality of arms **305*a*, 305*b* that each include a lift pin stop 122 on which at least one of the lift pins 132 can rest when the substrate support 106** is lowered (e.g., lowered from a process position to a transfer position).

The internal volume has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106.

The substrate support 106 may include lift pin holes 107 disposed therein. The lift pin holes 107 are sized to accommodate a lift pin 132 for lifting of the substrate 102 from the substrate support 106 either before or after a deposition process is performed.

The flow guide insert 1010 includes an isolation plate 321 having a first face 1012 and a second face 1013 opposing the first face 1012. The second face 1013 faces the substrate support 106. The flow guide insert 1010 includes an upper liner 1020. The upper liner 1020 includes an annular section 1021. The upper liner 1020 includes one or more inlet openings 1023 extending to an inner surface 1024 of the annular section 1021 on a first side of the upper liner 1020, and one or more outlet openings 1025 extending to the inner surface 1024 of the annular section 1021 on a second side of the upper liner 1020. It is contemplated that a portion or all of inner surface 1024 may be curved to engage with the isolation plate 321 as the isolation plate 321 is angled.

The one or more inlet openings 1023 extend from an outer surface 1026 of the annular section 1021 of the upper liner 1020 to the inner surface 1024. The one or more outlet openings 1025 extend from a lower surface 1029 of the upper liner 1020 to the inner surface 1024. The upper liner 1020 includes a first extension 1027 and a second extension 1028 disposed outwardly of the lower surface 1029 of the upper liner 1020. At least part of the annular section 1021 of the upper liner 1020 is aligned with the first extension 1027 and the second extension 1028. In the embodiment shown in FIG. 1, a lowermost end of the isolation plate 321 is aligned above a lowermost end of the upper liner 1020. In one or more embodiments, as shown in FIG. 1, the lowermost end of the isolation plate 321 is part of the second face 1013, and the lowermost end of the upper liner 1020 is part of the first extension 1027 and/or the second extension 1028. The present disclosure contemplates that the lowermost end of the upper liner 1020 can be part of the lower surface 1029.

The isolation plate 321 is in the shape of a disc, and the annular section 1021 is in the shape of a ring. It is contemplated, however, that the isolation plate 321 and/or the annular section 1021 can be in the shape of a rectangle, or other geometric shapes. The isolation plate 321 at least partially fluidly isolates the upper portion **136*b* from the lower portion 136*a***.

The flow module 112 (which can be at least part of one or more sidewalls of the processing chamber 1000) includes one or more first inlet openings 1014 in fluid communication with the lower portion **136*a* of the processing volume 136. The flow module 112 includes one or more second inlet openings 1015 in fluid communication with the upper portion 136*b* of the processing volume 136. The one or more first inlet openings 1014 are in fluid communication with one or more flow gaps between the upper liner 1020 and the lower liner 311. The one or more second inlet openings 1015 are in fluid communication with the one or more inlet openings 1023 of the upper liner 1020. The gas inlet(s) 1014 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. One or more process gases supplied using the one or more process gas sources 151 can include one or more reactive gases (such as one or more of silicon-containing, phosphorus-containing, and/or germanium-containing gases, and/or one or more carrier gases (such as one or more of nitrogen ($N_2$) and/or hydrogen ($H_2$)). One or more purge gases supplied using the one or more purge gas sources 162 can include one or more inert gases (such as one or more of argon (Ar), helium (He), and/or nitrogen ($N_2$)). One or more cleaning gases supplied using the one or more cleaning gas sources 153** can include one or more of hydrogen and/or chlorine. In one embodiment, which can be combined with other embodiments, the one or more process gases include silicon phosphide (SiP) and/or phosphine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. The exhaust system 178 is disposed on an opposite side of the processing chamber 100 relative to the flow module 112.

In one or more embodiments, as shown in FIG. 1, the one or more inlet openings 1023 are oriented in a horizontal orientation and the one or more outlet openings 1025 are oriented in an angled orientation. The present disclosure contemplates that the one or more inlet and/or outlet openings 1023, 1025 can be oriented in a horizontal orientation, oriented in an angled orientation, and/or can include one or more turns (such as the turns shown for the one or more first inlet openings 1014 and the one or more gas exhaust outlets 116).

During a deposition operation (e.g., an epitaxial growth operation), the one or more process gases P1 flow through the one or more first inlet openings 1014, through the one or more gaps, and into the lower portion 136*a* of the processing volume 136 to flow over the substrate 102. During the deposition operation, one or more purge gases P2 flow through the one or more second inlet openings 1015, through the one or more inlet openings 1023 of the upper liner 1020, and into the upper portion 136*b* of the processing volume 136. The one or more purge gases P2 flow simultaneously with the flowing of the one or more process gases P1. The flowing of the one or more purge gases P2 through the upper portion 136*b* facilitates reducing or preventing flow of the one or more process gases P1 into the upper portion 136*b* that would contaminate the upper portion 136*b*. The one or more process gases P1 are exhausted through gaps between the upper liner 1020 and the lower liner 311, and through the one or more gas exhaust outlets 116. The one or more purge gases P2 are exhausted through the one or more outlet openings 1025, through the same gaps between the upper liner 1020 and the lower liner 311, and through the same one or more gas exhaust outlets 116 as the one or more process gases P1. The present disclosure contemplates that that one or more purge gases P2 can be separately exhausted through one or more second gas exhaust outlets that are separate from the one or more gas exhaust outlets 116.

The present disclosure also contemplates that one or more purge gases can be supplied to the purge volume 138 (through the plurality of purge gas inlets 164) during the deposition operation, and exhausted from the purge volume 138.

As shown, a controller 195 is in communication with the processing chamber 1000 and is used to control processes and methods, such as at least some of the operations of the methods described herein.

The controller 195 is configured to receive data or input as sensor readings from a plurality of sensors. The sensors can include, for example: sensors that monitor growth of layer(s) on the substrate 102; sensors that monitor growth or residue on inner surfaces of chamber components of the processing chamber 1000 (such as inner surfaces of the upper window 108 and/or the liners 1020, 311); sensors that monitor gas flow of the one or more process gases P1; and/or sensors that monitor temperatures of the substrate 102, the substrate support 106, the upper window 108, the lower window 110, the upper liner 1020, and/or the lower liner 311. The controller 195 is equipped with or in communication with a system model of the processing chamber 100. The system model includes a heating model, a deposition model, a coating model, a rotational position model, and/or a gas flow model. The system model is a program configured to estimate parameters (such as a gas flow rate, an angular position of the plate 321, a height of the plate 321, a center-to-edge uniformity profile, a gas pressure, a processing temperature, a rotational position of component(s), a heating profile, a coating condition, and/or a cleaning condition) within the processing chamber 1000 throughout a deposition operation and/or a cleaning operation. The controller 195 is further configured to store readings and calculations. The readings and calculations include previous sensor readings, such as any previous sensor readings within the processing chamber 100. The readings and calculations further include the stored calculated values from after the sensor readings are measured by the controller 195 and run through the system model. Therefore, the controller 195 is configured to both retrieve stored readings and calculations as well as save readings and calculations for future use. Maintaining previous readings and calculations enables the controller 195 to adjust the system model over time to reflect a more accurate version of the processing chamber 100.

The controller 195 can monitor, estimate an optimized parameter, adjust the angular position of the plate 321 and/or the height of the plate 321, detect a coating condition for the upper window 108, generate an alert on a display, halt a deposition operation, initiate a chamber downtime period, delay a subsequent iteration of the deposition operation, initiate a cleaning operation, detect a cleaning condition for the upper window 108, halt the cleaning operation, adjust a heating power, and/or otherwise adjust the process recipe.

The controller 195 includes a central processing unit (CPU) 198 (e.g., a processor), a memory 196 containing instructions, and support circuits 197 for the CPU 198. The controller 195 controls various items directly, or via other computers and/or controllers. In one or more embodiments, the controller 195 is communicatively coupled to dedicated controllers, and the controller 195 functions as a central controller.

The controller 195 is of any form of a general-purpose computer processor that is used in an industrial setting for controlling various substrate processing chambers and equipment, and sub-processors thereon or therein. The memory 196, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits 197 of the controller 195 are coupled to the CPU 198 for supporting the CPU 198. The support circuits 197 include cache, power supplies, clock circuits, input/output circuitry and subsystems, and the like. Operational parameters (e.g., a center-to-edge profile, an angular position of the plate 321, a height of the plate 321, the coating condition, a pressure for process gases P1, a processing temperature, a heating profile, a flow rate for process gases P1, a pressure for cleaning gases, a flow rate for cleaning gases, and/or a rotational position of the substrate support 106) and operations are stored in the memory 196 as a software routine that is executed or invoked to turn the controller 195 into a specific purpose controller to control the operations of the various chambers/modules described herein. The controller 195 is configured to conduct any of the operations described herein. The instructions stored on the memory, when executed, cause one or more of operations of method 900 (described below) to be conducted in relation to the processing chamber 100. The controller 195 and the processing chamber 100 are at least part of a system for processing substrates.

The various operations described herein (such as the operations of the method 900) can be conducted automatically using the controller 195, or can be conducted automatically or manually with certain operations conducted by a user.

In one or more embodiments, the controller 195 includes a mass storage device, an input control unit, and a display unit. The controller 195 monitors the temperature of the substrate 102, the temperature of the substrate support 106, the temperature of the upper window 108, the process gas flow, and/or the purge gas flow. In one or more embodiments, the controller 195 includes multiple controllers 195, such that the stored readings and calculations and the system model are stored within a separate controller from the controller 195 which controls the operations of the processing chamber 100. In one or more embodiments, all of the system model and the stored readings and calculations are saved within the controller 195.

The controller 195 is configured to control the sensor devices, the deposition, the cleaning, the rotational position, the heating, and gas flow through the processing chamber 100 by providing an output to the controls for the heat sources, the gas flow, and the motion assembly 121. The controls include controls for the sensor devices, the upper heat sources 141, the lower heat sources 143, the process gas source 151, the purge gas source 162, the motion assembly 121, and the exhaust pump 157.

The controller 195 is configured to adjust the output to the controls based on the sensor readings, the system model, and the stored readings and calculations. The controller 195 includes embedded software and a compensation algorithm to calibrate measurements. The controller 195 can include one or more machine learning algorithms and/or artificial intelligence algorithms that estimate optimized parameters for the deposition operations and/or the cleaning operations (such as for adjusting a deposition operation (e.g. the process recipe), halting the deposition operation, initiating a chamber downtime period, delaying a subsequent iteration of the deposition operation, initiating a cleaning operation, halting the cleaning operation, adjusting a heating power, and/or adjusting the cleaning operation). The optimized parameter can include, for example, a center-to-edge profile for the substrate 102 (which facilitates uniformity) with respect to temperature, gas flow rate, and/or deposition thickness.

The one or more machine learning algorithms and/or artificial intelligence algorithms may implement, adjust and/or refine one or more algorithms, inputs, outputs or variables described above. Additionally or alternatively, the one or more machine learning algorithms and/or artificial intelligence algorithms may rank or prioritize certain aspects of adjustments of the process chamber 1000 and/or the method 900 relative to other aspects of the process chamber 1000 and/or the method 900. The one or more machine learning algorithms and/or artificial intelligence algorithms may account for other changes within the processing systems such as hardware replacement and/or degradation. In one or more embodiments, the one or more machine learning algorithms and/or artificial intelligence algorithms account for upstream or downstream changes that may occur in the processing system due to variable changes of the process chamber 1000 and/or the method 900. For example, if variable "A" is adjusted to cause a change in aspect "B" of the process, and such an adjustment unintentionally causes a change in aspect "C" of the process, then the one or more machine learning algorithms and/or artificial intelligence algorithms may take such a change of aspect "C" into account. In such an embodiment, the one or more machine learning algorithms and/or artificial intelligence algorithms embody predictive aspects related to implementing the process chamber 1000 and/or the method 900. The predictive aspects can be utilized to preemptively mitigate unintended changes within a processing system.

The one or more machine learning algorithms and/or artificial intelligence algorithms can use, for example, a regression model (such as a linear regression model) or a clustering technique to estimate optimized parameters. The algorithm can be unsupervised or supervised. The one or more machine learning algorithms and/or artificial intelligence algorithms can optimize, for example, a heating power applied to the heat sources 141, 143, the angular position of the plate 321, and/or the height of the plate 321. The one or more machine learning algorithms and/or artificial intelligence algorithms can optimize, for example, a size and/or a shape of the lower portion 136*a* and/or the upper portion 136*b* using the angular position and/or the height of the plate 321.

The one or more machine learning algorithms and/or artificial intelligence algorithms can optimize, for example, a center-to-edge gas concentration profile across a substrate 102 during deposition operations. The center-to-edge gas concentration profile can be pre-generated using simulation operations, and the one or more machine learning algorithms and/or artificial intelligence algorithms can use real-time collected data to adjust the center-to-edge gas concentration profile. The center-to-edge concentration profile is affected, for example, by the size and/or the shape of the lower portion 136*a*.

In one or more embodiments, the controller 195 automatically conducts one or more operations described herein without the use of one or more machine learning algorithms or artificial intelligence algorithms. In one or more embodiments, the controller 195 compares measurements (such as of gas flow rate(s)) and/or deposition thickness to data in a look-up table and/or a library to determine if adjustment(s)

can be used to facilitate a center-to-edge profile. The controller 195 can stored measurements as data in the look-up table and/or the library.

Figure 2:
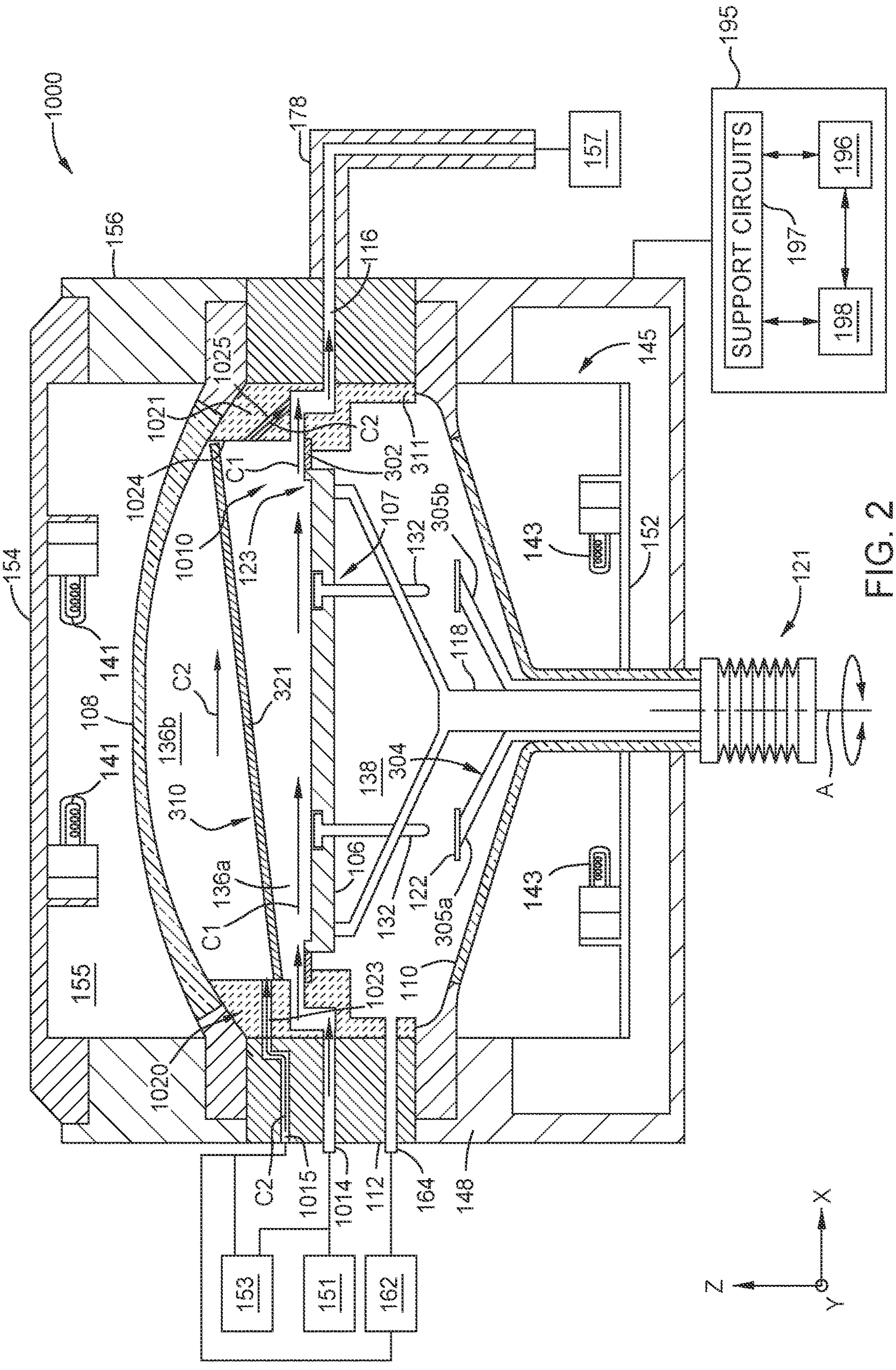
FIG. 2 is a partial schematic side cross-sectional view of the processing chamber, according to one or more embodiments.

FIG. 2 is a partial schematic side cross-sectional view of the processing chamber 1000 shown in FIG. 1, according to one or more embodiments. The processing chamber 1000 is shown in a cleaning condition in FIG. 2.

During a cleaning operation, one or more cleaning gases C1 flow through the one or more first inlet openings 1014, through the one or more gaps (between the upper liner 1020 and the lower liner 311), and into the lower portion 136*a* of the processing volume 136. During the cleaning operation, one or more cleaning gases C2 flow through the one or more second inlet openings 1015, through the one or more inlet openings 1023 of the upper liner 1020, and into the upper portion 136*b* of the processing volume 136. The one or more cleaning gases C2 flow simultaneously with the flowing of the one or more cleaning gases C1. The present disclosure contemplates that the one or more cleaning gases C2 used to clean surfaces adjacent the upper portion 136*b* can be the same as or different than the one or more cleaning gases C1 used to clean surfaces adjacent the lower portion 136*a* of the processing volume 136.

The processing chamber 1000 facilitates separating the gases provided to the lower portion 136*a* from the gases provided to the upper portion 136*b*, which facilitates parameter adjustability. Additionally, one or more purge gases and one or more cleaning gases can be separately provided to the upper portion 136*b* to facilitate reduced contamination of the window 108 and/or the isolation plate 321.

As shown in FIGS. 1 and 2, the one or more second inlet openings 1015 can be aligned above the one or more first inlet openings 1014, and the one or more inlet openings 1023 of the upper liner 1020 can be aligned above the one or more gaps between the upper liner 1020 and the lower liner 311. The one or more second inlet openings 1015 can be angularly offset from the one or more first inlet openings 1014, and the one or more inlet openings 1023 of the upper liner 1020 can be angularly offset from the one or more gaps between the upper liner 1020 and the lower liner 311.

The flow of gases in the lower portion 136*a* and the upper portion 136*b* during both the deposition operation and the cleaning operation facilitates reduced or eliminated backflow of gases at the one or more outlet openings 1025 (e.g., backflow from the one or more outlet openings 1025 into the upper portion 136*b*) and the one or more gas exhaust outlets 116 (e.g., backflow from the gaps into the lower portion 136*a*).

Figure 3:
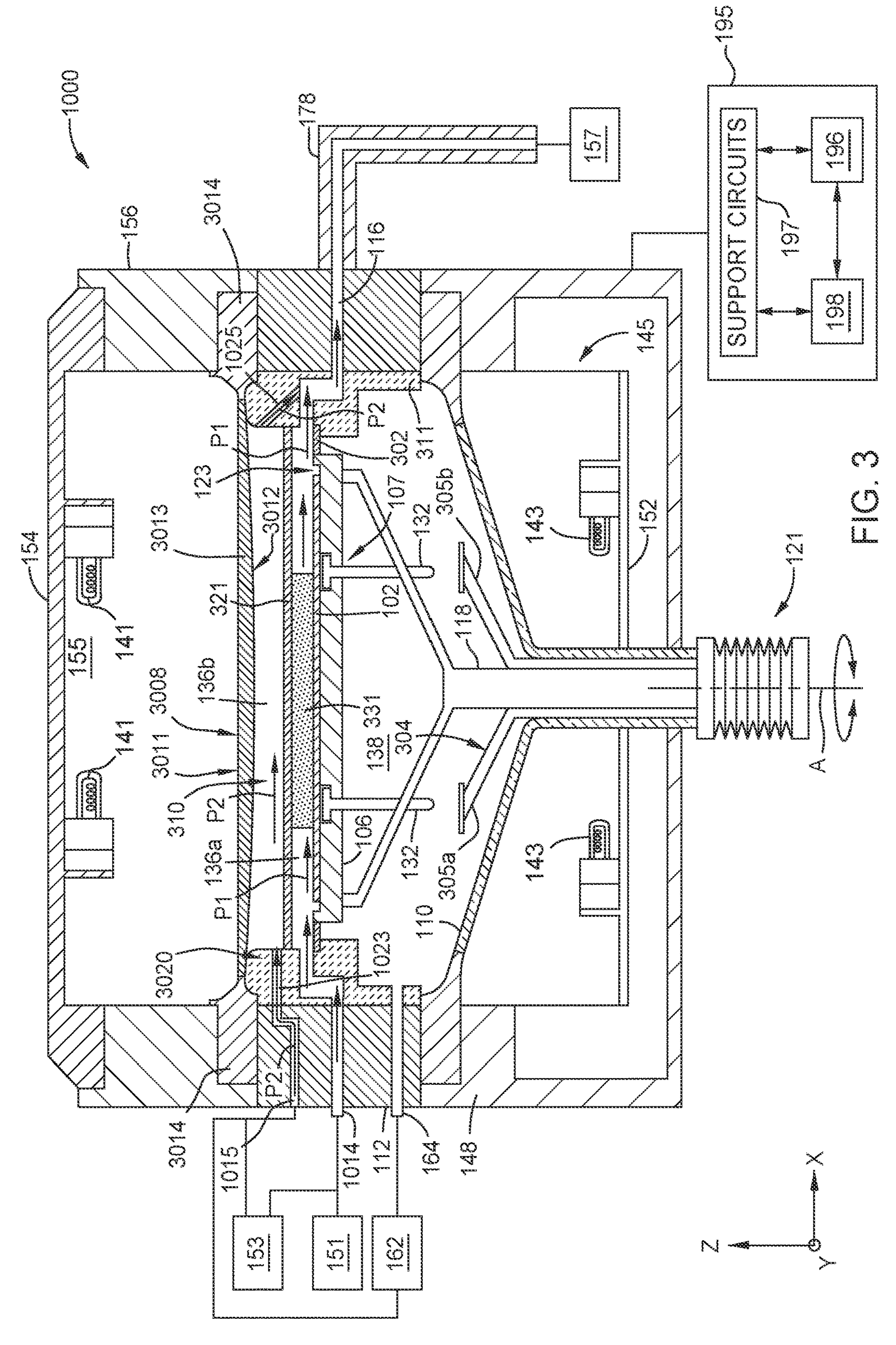
FIG. 3 is a partial schematic side cross-sectional view of a processing chamber, according to one or more embodiments.

FIG. 3 is a partial schematic side cross-sectional view of a processing chamber 3000, according to one or more embodiments. The processing chamber 3000 is similar to the processing chamber 1000 shown in FIGS. 1 and 2, and includes one or more of the aspects, features, components, properties, and/or operations thereof. The processing chamber 3000 is shown in a processing condition in FIG. 3.

The processing chamber 3000 includes a window 3008 that at least partially defines the processing volume 136. The window 3008 includes a first face 3011 that is concave or flat (in the embodiment shown in FIG. 3, the first face 3011 is flat). The window 3008 includes a second face 3012 that is convex. The second face 3012 faces the substrate support 106.

The processing chamber 3000 includes a liner 3020. The liner 3020 is similar to the upper liner 1020 shown in FIGS. 1 and 2, and includes one or more of the aspects, features, components, properties, and/or operations thereof. The processing chamber 3000 incudes a flow guide insert 310 (shown in FIG. 4). A parallel block 331 is disposed below an isolation plate 321 and above the substrate support 106. The parallel block 331 assists with flow of process gas P1 over the substrate 102 to facilitate improving deposition uniformity. In one or more embodiments, the flow guide insert 310 is supported by and/or coupled to the upper liner 3020 and/or the pre-heat ring 302. In one or more embodiments, the flow guide insert 310 rests on the upper liner 3020 and/or the pre-heat ring 302.

The window 3008 includes an inner section 3013 and an outer section 4014. The first face 3011 and the second face 3012 are at least part of the inner section 3013. The inner section 3013 is transparent and the outer section 3014 is opaque. The outer section 3014 is received at least partially in one or more sidewalls (such as in the flow module 112 and/or the upper body 156) of the processing chamber 3000.

Figure 4:
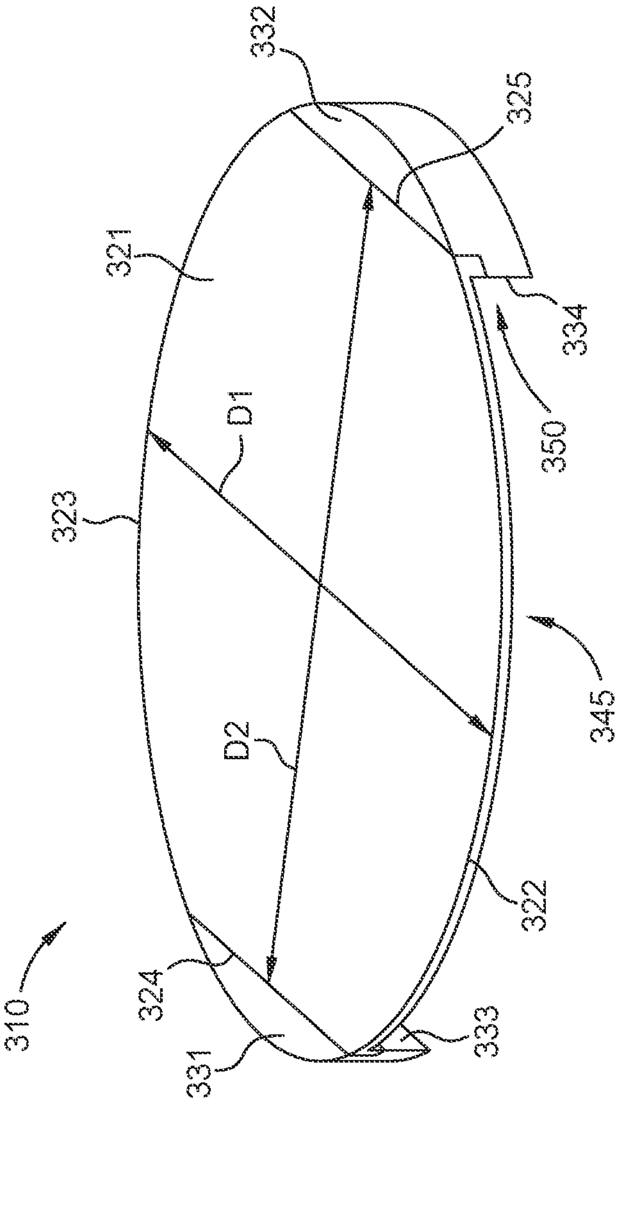
FIG. 4 is a schematic partial perspective view of a flow guide insert, according to one or more embodiments.

FIG. 4 is a schematic partial perspective view of the flow guide insert 310, according to one or more embodiments.

The isolation plate 321 has a first side 322 (adjacent the gas inlets 114 in FIGS. 3 and 4) and a second side 323 opposing the first side 322 along a first direction D1. Each of the first side 322 and the second side 323 is arcuate.

In FIG. 4, the flow guide insert 310 incudes the first parallel block 331 extending outwardly relative to a third side 324 of the isolation plate 321 and outwardly relative to an outer face 345 of the isolation plate 321, and a second parallel block 332 extending outwardly relative to a fourth side 325 of the isolation plate 321 and outwardly relative to the outer face 345 of the isolation plate 321. It is contemplated that the first parallel block 331 and the second parallel block 332 may be omitted from the flow guide insert 310 (as shown in FIGS. 1 and 2). In one or more embodiments where the parallel blocks 331 and 332 are omitted, the isolation plate 321 can be supported by the upper liner 1020 and/or the isolation plate 321 may be attached to the interior of the processing chamber via a pivot point or another attachment mechanism. The fourth side 325 opposes the third side 324 along a second direction D2 that intersects the first direction D1. In one or more embodiments, the second direction D2 is perpendicular to the first direction D1. The third side 324 and the fourth side 325 are linear. In FIGS. 1-3, the first and second parallel blocks 331, 332 are supported at least partially on the substrate support 106 such that raising and lowering of the substrate support 106 raises and lowers the flow guide insert 310 via the parallel blocks 331, 332. A rectangular flow opening 350 is defined between a first planar inner face 333 of the first parallel block 331 and a second planar inner face 334 of the second parallel block 332. Each of the first parallel block 331 and the second parallel block 332 is semi-circular in shape. In one or more embodiments, the isolation plate 321 is formed of quartz and the first and second parallel blocks 331, 332 are each formed of silicon carbide (SiC). The rectangular flow opening 350 has a 3-D rectangular box shape such that the rectangular flow opening 350 has a rectangular shape in each of the X-Y plane, the X-Z plane, and the Y-Z plane. When the flow guide insert 310 is in the processing position, the rectangular flow opening 350 is defined by one or more of the first planar inner face 333, the second planar inner face 334, an upper surface of the substrate 102, an upper surface of the substrate support 106, and/or an upper surface of the pre-heat ring 302.

It is contemplated that in embodiments with the first and second parallel blocks 331, 332, the size of the parallel blocks may be varied to increase or decrease the lower portion 136*a* of the processing volume 136. It is also contemplated that the first and second parallel blocks 331, 332 may include actuating supports configured to mechanically move the isolation plate 321 up and down.

In or more embodiments, it is contemplated that upper and lower interfacing surfaces of the isolation plate 321 and the first and second parallel blocks 331, 332 may be curved and having matching radii of curvature (e.g., are semicircular). The interfacing curved surfaces allow rotation of the isolation plate 321 relative to the first and second parallel blocks 331, 332 while preventing airflow between the interface of the isolation plate 321 relative to the first and second parallel blocks 331, 332.

The one or more process gases P1 flow through the rectangular flow opening 350 when flowing through the lower portion 136*a* and over the substrate 102. The rectangular flow opening 350 facilitates adjustability of process gases, purge gases, and/or cleaning gases (such as pressure and flow rate), to facilitate process uniformity and deposition uniformity while providing a path for cleaning gases to the upper portion 136*b*. As an example, the rectangular flow opening 350 facilitates using high pressures and low flow rates for the process gases and the cleaning gases. The rectangular flow opening 350 also facilitates mitigation of the effects that rotation of the substrate 102 has on process uniformity and film thickness uniformity during a deposition operation. As an example, the rectangular flow opening mitigates or removes the effects of gas vortex.

Figure 5A:
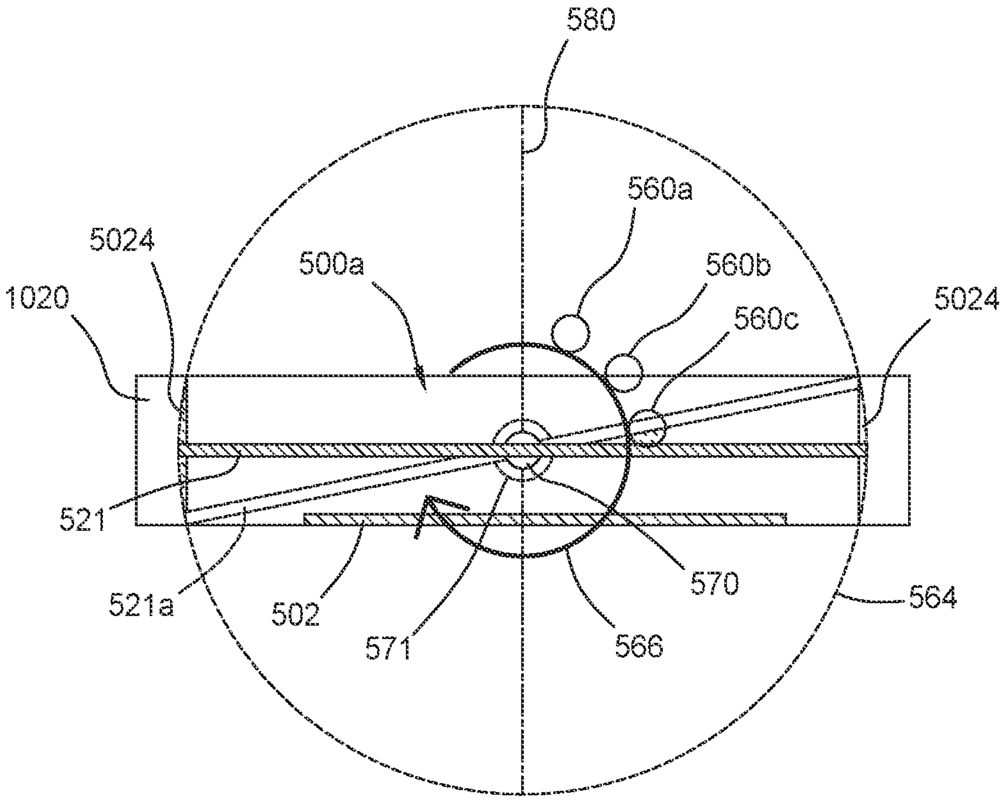
FIG. 5A is a partial schematic side cross-sectional views of an isolation plate and adjustment mechanism, according to one or more embodiments.

FIG. 5A is a partial schematic side cross-sectional view of an isolation plate 521 and an adjustment mechanism 500, according to one or more embodiments. The isolation plate 521 and adjustment mechanism 500 may be utilized in either of processing chambers 1000 and/or 3000. The adjustment mechanism 500 facilitates adjustment of a plane of the isolation plate 521, relative to a plane of the substrate support 106 and/or substrate 502. Adjustment of the orientation of the plane of the isolation plate 521 relative to a plane of the substrate 502 changes the relative distances between portions of the isolation plate 521 and the substrate 502. The change in distance affects the velocity of gases flowing between the isolation plate 521 and the substrate 502, such that the velocity at the leading edge of the substrate 502 can be adjusted relative to the velocity at the trailing edge of the substrate 502. Since deposition rate is proportional to gas velocity, the deposition rate from leading-to-trailing-edge of the substrate 502 can be adjusted by changing the orientation of the isolation plate 521. These changes can result in deposition of more uniform film thickness across the substrate 502.

In FIG. 5A, the adjustment mechanisms 500A includes a pivot shaft 570, about which a plane of the isolation plate 521 rotates. In one or more embodiments, the pivot shaft 570 is located in the center 580 of the processing chambers 1000, 3000 (e.g., equidistant from a gas inlet and gas outlet of the processing chambers 1000, 3000, or perpendicular to a flow path of process gases over the substrate 502). Thus, in one or more embodiments, adjustments to the isolation plate 351 result in equal (e.g., absolute) changes in plate position at the leading edge of the isolation plate (e.g., +X mm) and the trailing edge of the isolation plate 521 (e.g., −X mm). It is contemplated that the pivot shaft 570 may not be positioned at a center of the processing chamber or the isolation plate. For reference, the sectional view shown in FIG. 5A is positioned such that process gas would flow from the left of the image to the right of the image, in a crossflow chamber, such as processing chamber 1000 and/or 3000. Other orientations are also contemplated.

For reference, the upper liner 1020 is shown in FIG. 5A. The upper liner 1020 may optionally include a concave surface 5024 on a radially inward surface thereof. The concave surface 5024 is sized to maintain a predetermined distance between the distal ends of the isolation plate 521 and the upper liner 1020 as the isolation plate 521 is rotated. Thus, gas escapement between the isolation plate 521 and the upper liner 1020 is reduced. It is contemplated that concave surface 5024 extends substantially around the entire inner surface of the upper liner 1020.

The pivot shaft 570 is disposed within the upper liner 1020, and rotatable within a receptacle thereof. In one or more embodiments, the pivot shaft 570 may be received within a bearing sleeve housed within the upper liner 1020 to facilitate pivoting (such as rotation). An actuator 571 is coupled to the pivot shaft 570 to induce movement. The actuator may be, for example, a stepper motor, a pneumatic actuator, or the like. Additionally, while one pivot shaft 570 is shown, it is contemplated that the isolation plate 521 may include a second pivot shaft opposite the first pivot shaft (e.g., spaced 180 degrees therefrom) to provide increased support to the isolation plate.

The adjustment mechanism 500A includes lock pins 560*a*, 560*b*, 560*c*. In one or more embodiments, the adjustment mechanism may include more or fewer lock pins 560*a*, 560*b*, 560*c*. The positions of the lock pins 560*a*, 560*b*, 560*c* determine an adjusted position of the isolation plate 521*a*. In one or more embodiments, the positions of the lock pins 560*a*, 560*b*, 560*c* may be determined based on the position of the isolation plate 521 relative to a substrate 502. In one or more embodiments, it is contemplated that the isolation plate 521 is mounted to a pivot shaft 570, and an optional lock pin 560*a*, 560*b*, 560*c* is inserted into the upper liner 1020 based on the desired angle of the isolation plate 521, in order to secure the isolation plate 5221 into position. The isolation plate 521 rests on the inserted lock pin 560*a*, 560*b*, 560*c*. It is also contemplated that the lock pins 560*a*, 560*b*, 560*c* are located on a mechanism that locks the angle of the isolation plate. In one or more embodiments, a wheel is located around the pivot shaft 570 that has holes therein for insertion of the lock pins 560*a*, 560*b*, 560*c*.

As shown in FIG. 5A, the adjustment mechanism 500A enables a clockwise rotation 566 of the isolation plate 521. In one or more embodiments, the adjustment mechanism 500A enables counterclockwise rotation, and/or both clockwise and counterclockwise rotation. Circle 564 illustrates the extent that the isolation plate 521 may be rotated, wherein circle 564 is bisected by the center 580 of the processing chamber 1000, 3000. It is contemplated that a vertical position of a substrate support may be adjusted, as needed, to accommodate positioning of the isolation plate 521. In one or more embodiments, the isolation plate 521 is capable of a maximum of ±30° of rotation. In one or more embodiments, the isolation plate 521 is capable of a maximum of ±5° of rotation. In one or more embodiments, the isolation plate 521 is capable of a maximum of ±3.5° of rotation.

Figure 5B:
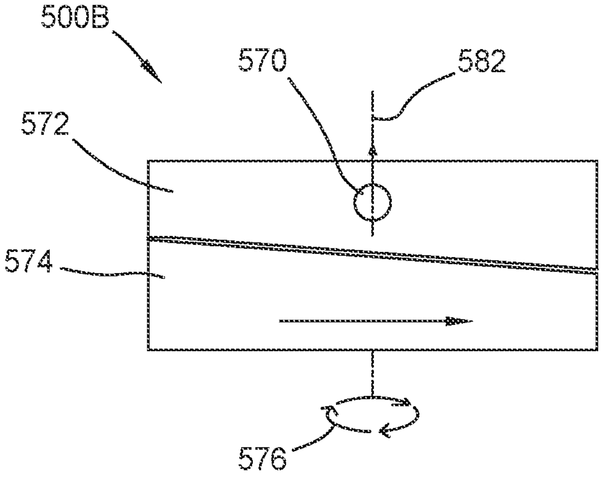
FIG. 5B is a partial schematic side cross-sectional view of an adjustment mechanism, according to one or more embodiments.
Figure 5D:
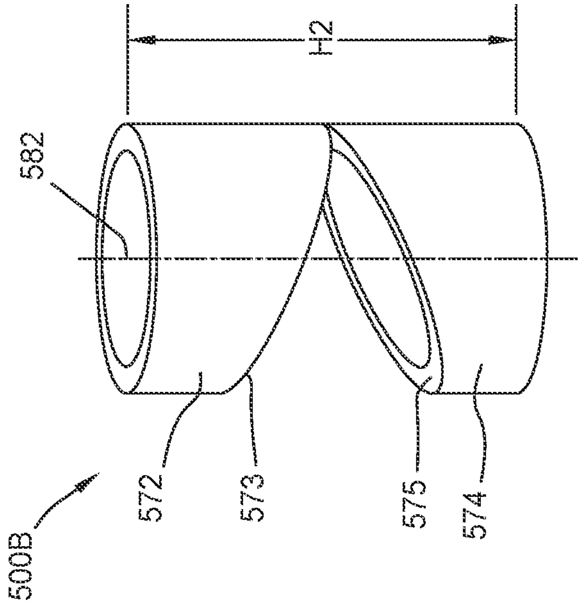
FIGS. 5C-5D are schematic partial perspective views of an adjustment mechanism, according to one or more embodiments.
Figure 5C:
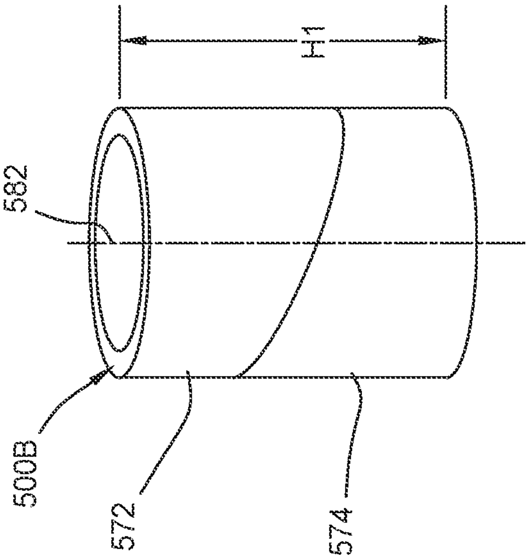

FIGS. 5B-5D illustrate an adjustment mechanism 500B, according to one or more embodiments. As shown in FIGS. 5B-5D, the adjustment mechanism 500B includes an upper member 572 and a lower member 574. The pivot shaft 570 is located in (and/or coupled to) the upper member 572 to allow for adjustment of the plane of the isolation plate. The pivot shaft 570 supports an isolation plate, such as isolation plate 521 shown in FIG. 5A. With reference to FIGS. 1 and 3, the lower member 574 is coupled to the inner surface 1024 of the upper liner 1020 of either of the processing chambers 1000 or 3000. It is contemplated that a lip or a ring may be coupled to the inner surface 1024 to facilitate coupling of the lower member 574 to the inner surface 1024. It is also contemplated that the upper member 572 interacting with the inner surface 1024 may form a self-locking mechanism, such as the upper member 572 and the inner surface 1024 being threaded, to support the movement of the upper member 572. Other manners of supporting the upper member 572 and the lower member 574 are further contemplated. The lower member 574 rotates about a central axis 582 of the lower member 574 (e.g., coaxially with axis A of FIGS. 1 and 3) in a clockwise direction 576. In one or more embodiments, the lower member 574 may rotate in a counterclockwise direction.

The adjustment mechanism 500B is a bifurcated cylinder having an upper member 572 and a lower member 574. The upper member 572 has a lower surface 573 that mates to an upper surface 575 of the lower member 574. The lower surface 573 of the upper member 572 and the upper surface 575 of the lower member 574 are disposed in a plane non-orthogonal to the central axis 582 of the adjustment mechanism 500B. Thus, rotation of the lower member 574 relative to the upper member 572 (or vice versa) results in vertical actuation of the upper member 572 in response to changing engagement of the mating surfaces between the lower member 574 and the upper member 572. Thus, the relative vertical position (such as a height) of an isolation plate coupled to the upper member 572 is changed within a processing chamber as the lower member 574 actuates. To facilitate vertical actuation of the upper member 572, it is contemplated that the upper member 572 may ride on rails or tracks to direct the upper member 572 as vertical change occurs. The lower member 574 or upper member 572 may be actuated, for example, using an actuator such as a mechanical motor, pneumatic motor, or stepper motor.

In FIG. 5C, the adjustment mechanism 500B is in a first position. In FIG. 5C, the adjustment mechanism has a first height H1. In FIG. 5D, the adjustment mechanism 500B is in a second (e.g., rotated) position. In FIG. 5D, the adjustment mechanism has a second height H2. The second height H2 is greater than the first height H1. It is contemplated that the lower member 574 may only partially rotate to extend the upper member 572 to a height between H1 and H2. It is contemplated that adjustment mechanism 500B may incorporate other structures to stabilize and facilitate the movement of adjustment mechanism 500B.

The adjustment mechanism 500A may utilize adjustment mechanism 500B in combination with an angling mechanism to induce a wider angled movement in the isolation plate 521. In one or more embodiments, the adjustment mechanism 500A may utilize other methods of angling the isolation plate 521.

Figure 6:
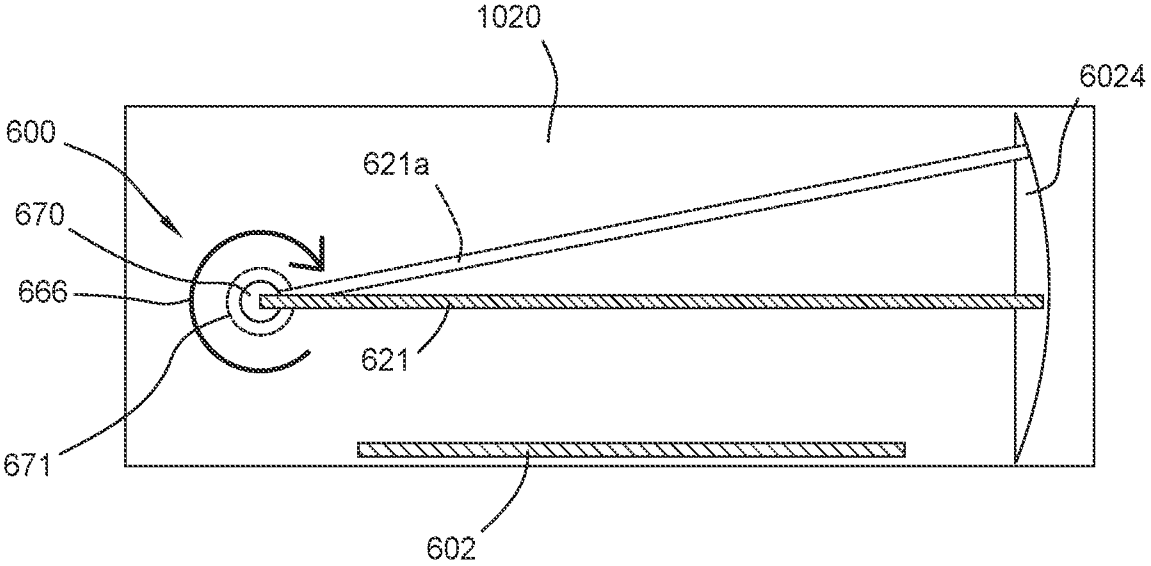
FIG. 6 is a partial schematic side cross-sectional view of an isolation plate and adjustment mechanism, according to one or more embodiments.

FIG. 6 is a partial schematic side cross-sectional view of an isolation plate 621 and an adjustment mechanism 600, according to one or more embodiments. The isolation plate 621 and adjustment mechanism 600 may be utilized in either of processing chambers 1000 and/or 3000. The adjustment mechanism 600 is similar to the adjustment mechanism 500, and the isolation plate 621 pivots at an endpoint thereof instead of at a midpoint thereof as with isolation plate 521. In one or more embodiments, the isolation plate 621 can pivot at the endpoint such that the moving of the isolation plate 621 results in approximately no change in a height (e.g., a change of 1.0 mm or less, such as 0.5 mm or less) of a first end of the isolation plate 621.

In FIG. 6, the adjustment mechanism 600 includes a pivot shaft 670. The pivot shaft 670 is located adjacent a gas inlet or gas outlet of the processing chamber, and supports the isolation plate 621 in a cantilevered manner. In one or more embodiments, the pivot shaft 670 is located directly vertically above either the gas inlet or gas outlet of the processing chamber. The pivot shaft 670 is coupled to the upper liner 1020, and actuated by an actuator 671. In the example of FIG. 6, the distance between the isolation plate 621 and substrate 602 changes to a lesser degree near the pivot shaft 670 compared to the distance between the isolation plate 621 and substrate 602 at an end opposite the pivot shaft 670 (as shown by the adjusted position 621*a* of the isolation plate 621). Thus, in one or more embodiments, gas velocity is differentially adjusted across the surface of the substrate 602 by the changing distance between the substrate 602 and the isolation plate 621.

As shown in FIG. 6, the adjustment mechanism 600 enables a clockwise rotation 666 of the isolation plate 621. In one or more embodiments, the adjustment mechanism 600 may enable counterclockwise rotation, or both clockwise and counterclockwise rotation. The adjustment mechanism 600 may be rotated more or less depending on the desired angle between the isolation plate 621 and the substrate 602. The pivot shaft 670 may rotate via actuator 671, manual operation, or other forms of inducing rotation. Features of the adjustment mechanism 600 of FIG. 6 may be used in combination with features of the adjustment mechanism 500A of FIG. 5A or the adjustment mechanism 500B of FIGS. 5B-5D. The outer edge of the isolation plate 621 travels along a concave surface 6024 of the upper liner 1020 to reduce gas flow between the isolation plate 621 and the upper liner 1020 due to rotation of the isolation plate 621. In one or more embodiments, the isolation plate 621 may be capable of a maximum of ±30° of rotation. In one or more embodiments, the isolation plate 621 may be capable of a maximum of ±5° of rotation. In one or more embodiments, the isolation plate 621 may be capable of a maximum of ±3.5° of rotation.

Figure 7:
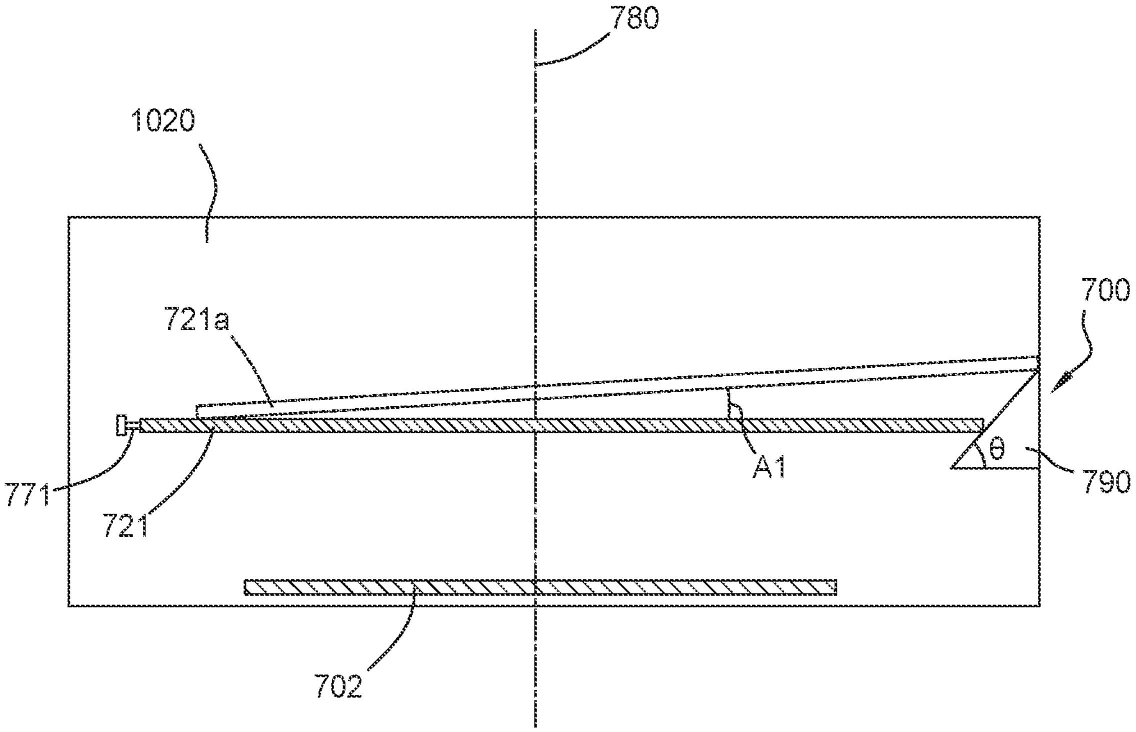
FIG. 7 is a partial schematic side cross-sectional view of an isolation plate and adjustment mechanism, according to one or more embodiments.

FIG. 7 is a partial schematic side cross-sectional view of an isolation plate 721 and an adjustment mechanism 700, according to one or more embodiments. The isolation plate 721 and adjustment mechanism 700 may be utilized in either of processing chambers 1000 or 3000.

In FIG. 7, the adjustment mechanism 700 includes a ramp 790 and an actuator 771 for guiding the isolation plate 721 up the ramp 790. Movement of the isolation plate 721 along the ramp surface changes an orientation of the plane of the isolation plate 721. As shown in FIG. 7, the ramp 790 may be located on an inner surface of the upper liner 1020, opposite an actuator 771. In other embodiments, the ramp 790 may be located in other positions such that movement of the isolation plate 721 by the actuator 771 along a surface of the ramp 790 results in a change of the planar orientation of the isolation plate 721 relative to a plane of the substrate 702 to adjust an angle of a plane of the isolation plate 721 relative to the plane of the substrate 702. In one or more embodiments, the isolation plate 721 is moved to a non-parallel orientation relative to the substrate 702. For example, a plane (such as a plane of a lower surface) of the isolation plate 721 can be pivoted (such as rotated) to intersect a plane (such as a plane of an upper surface) of the substrate 702 at an intersection angle A1 that is 3 degrees or larger, such as 5 degrees or larger. In one or more embodiments, the angle A1 is within a range of 0 degrees to 15 degrees.

As shown in FIG. 7, the ramp 790 has an angle θ. The angle θ may be larger or smaller based on a desired adjusted position of the isolation plate 721*a*. In one or more embodiments, the angle θ ranges from 0° to 15°. In one or more embodiments, the angle θ is about equal to the angle A1. The present disclosure contemplates that the angle A1 can be different from the angle θ. In one or more embodiments, the upper surface of the ramp 790 may be curved (e.g., non-linear) to facilitate graduated adjustment of the isolation plate 721 as the isolation plate 721 moves along the ramp 790. The amount that the isolation plate 721 is pushed up the ramp 790 may vary based on the desired adjusted position of the isolation plate 721*a*. The isolation plate 721 may be pushed up the ramp 790 via the actuator 771, or other forms of inducing movement. Features of the adjustment mechanism 700 of FIG. 7 may be used in combination with features of the adjustment mechanism 500A of FIG. 5A, the adjustment mechanism 500B of FIGS. 5B-5D, or the adjustment mechanism 600 of FIG. 6.

Figure 8A:
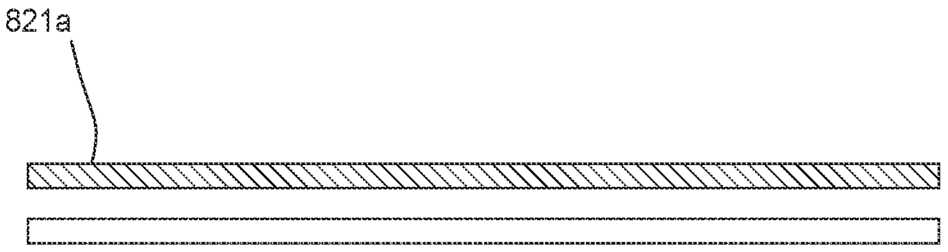
FIGS. 8A-8B are partial schematic side cross-sectional views of isolation plates, according to or more embodiments.
Figure 8B:
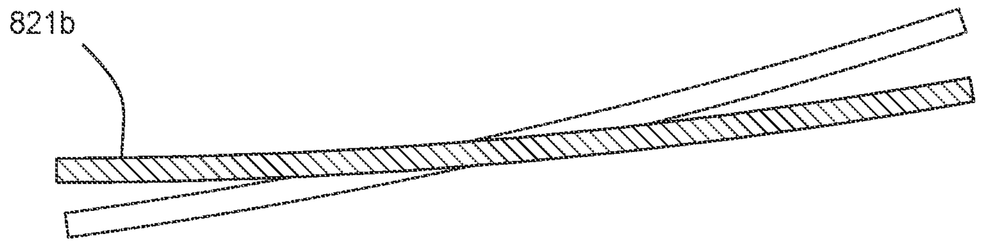

FIGS. 8A-8B are partial schematic side cross-sectional views of isolation plates 821*a*, 821*b*, according to one or more embodiments. The isolation plate 821*a* is planar, as shown in FIG. 8A. It is contemplated that the isolation plate 821*a* may be used in any embodiment described herein. In one or more embodiments, the isolation plate 821*b* may be curved, as shown in FIG. 8B, and may alternatively be used in any embodiment described herein. In one or more embodiments, the curved isolation plate 821*b* may have a curvature that is parabolic, quadratic, or any other regular or irregular function. It is also contemplated that the curved isolation plate 821*b* may have include both curved and uncurved (straight) portions. It is contemplated that the height differential between the lowest point in the curved isolation plate 821*b* and the highest point in the curved isolation plate may be 25 mm or less. The isolation plate 821*b* curvature may be determined based on computational fluid dynamics (CFD) modeling, experimentation, or other methods of determining optimal gas flowrate within a processing chamber. The curved isolation plate 821*b* reduces the need for and/or amount of mechanical movement of the isolation plate 821*b* to achieve the predetermined plate angling.

The isolation plates 821*a*, 821*b* may be moved vertically and/or pivoted relative to (such as rotated about) axes to achieved desired orientation. For example, the isolation plate 821*a* may be moved vertically to an adjusted position, as shown in phantom in FIG. 8A. The curved isolation plate 821*b* may be angled and/or pivoted (such as rotated) to an adjusted position, as shown in phantom in FIG. 8B. It is contemplated that either of the isolation plates 821*a*, 821*b* may be pivoted (such as rotated) and/or vertically actuated, and it is to be noted that the illustrations of FIGS. 8A and 8B are merely examples. Features of the isolation plates 821*a*, 821*b* of FIGS. 8A-8B may be used in combination with features of the adjustment mechanism 500A of FIG. 5A, the adjustment mechanism 500B of FIGS. 5B-5D, the adjustment mechanism 600 of FIG. 6, and/or the adjustment mechanism 700 of FIG. 7.

Figure 9:
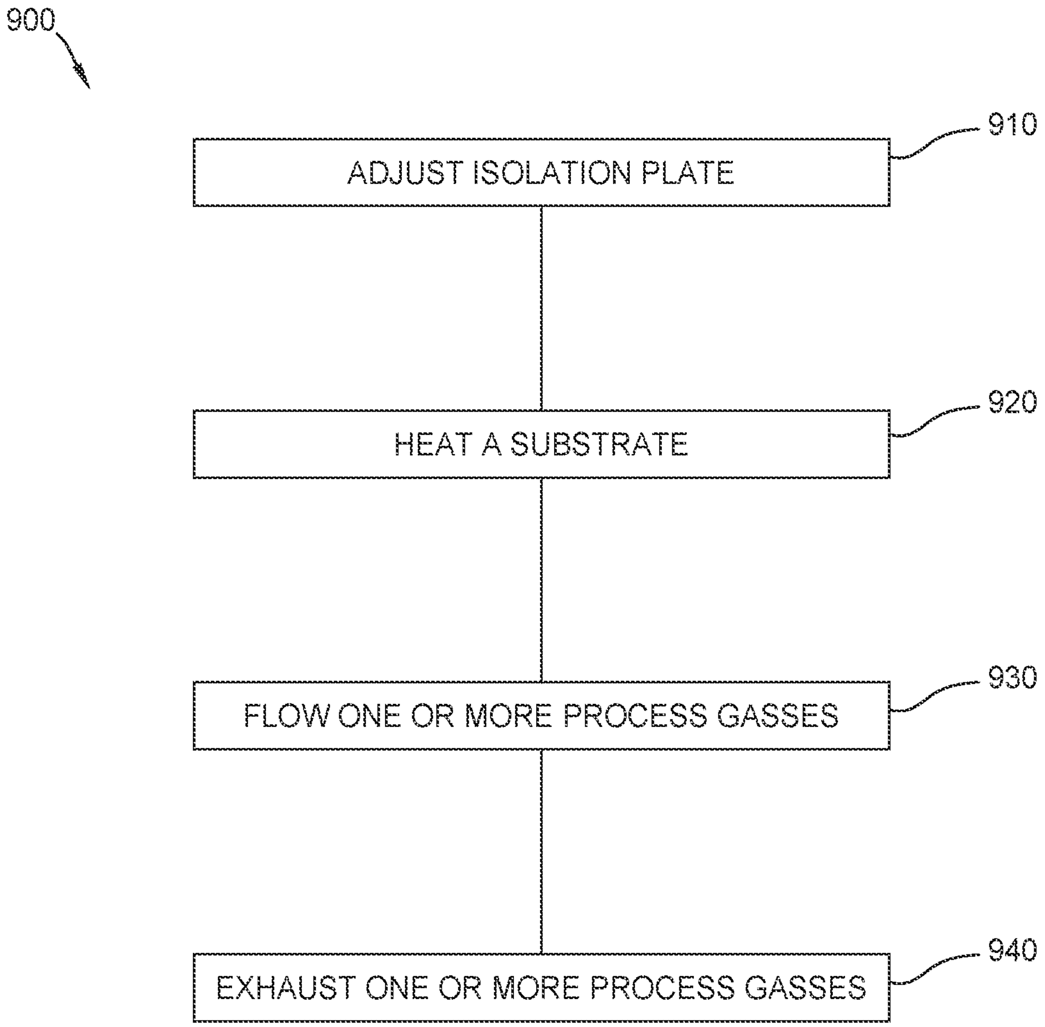
FIG. 9 is a schematic block diagram view of a method of processing substrates, according to one or more embodiments.

FIG. 9 is a schematic block diagram view of a method 900 of processing substrates, according to one or more embodiments.

Operation 910 includes adjusting an isolation plate within a processing chamber. Operation 910 may be performed, for example, via the adjustment mechanisms 500, 600, 700. The isolation plate may be adjusted up, down, and/or at an angle. In one or more embodiments, the adjusting includes moving the isolation plate to adjust one or more of: a height of the isolation plate, or an angle of the isolation plate such that the isolation plate moves to a non-parallel orientation relative to the substrate.

In one or more embodiments, the isolation plate is adjusted to more uniformly deposit a layer on the substrate. In one or more embodiments, the isolation plate is adjusted to decrease the time for a cleaning operation. In one or more embodiments, the isolation plate may be adjusted based on the specific process gases utilized in operation 930. Operation 910 may be performed prior to, simultaneously with, and/or after operations 920, 930, 940. It is contemplated that a position of the isolate plate may be empirically determined, modeled, and/or derived via metrology data obtained during processing. A controller (such as the controller 195) may store instructions that control an actuator to adjust the isolation plate in order to achieve predetermined process results.

In one or more embodiments, the isolation plate is adjusted so that the velocity of the process gas near the trailing edge of a substrate is less than the velocity of the process gas near the leading edge of the substrate. Leading edges of substrates can be subjected to higher deposition rates due to increased precursor concentration in the process gas. Rotating the substrate may not satisfactorily reduce or eliminate the deposition non-uniformities, because rotating can lead to "center low" deposition relative to the edge of the substrate. However, slowing the gas velocity by adjusting the isolation plate angle increases the deposition rate towards the trailing edge, resulting in increased deposition uniformity. When combined with substrate rotation, the "center low" effect is further reduced.

Operation 920 includes heating a substrate positioned on a substrate support. Operation 920 may be performed prior to, simultaneously with, and/or after operation 910. Heating occurs via a plurality of heat sources (such as radiant heat sources), and to a predetermined temperature, as described above.

Operation 930 includes flowing one or more process gases over the substrate to form one or more layers on the substrate. The flowing of the one or more process gases over the substrate includes optionally guiding the one or more process gases through a rectangular flow opening of a flow guide insert. In one or more embodiments, the one or more process gases are supplied at a pressure that is 300 Torr or greater, such as within a range of 300 Torr to 600 Torr, or greater. In one or more embodiments, the one or more process gases are supplied at a flow rate that is less than 5,000 standard cubic centimeters per minute (SCCM). In one or more embodiments, the substrate is rotated at a rotation speed that is less than 8 rotations-per-minute (RPM) during the flowing of the one or more process gases over the substrate. In one or more embodiments, the rotation speed is 1 RPM.

Operation 940 includes exhausting the one or more process gases through an exhaust path formed at least partially in a sidewall.

Other processes may be performed before, during, or after the completion of the method 900. In one or more embodiments, purge gases may be flowed through the processing chamber during method 900. In one or more embodiments, cleaning gas may be flowed through the processing chamber after the completion of method 900.

Figure 10:
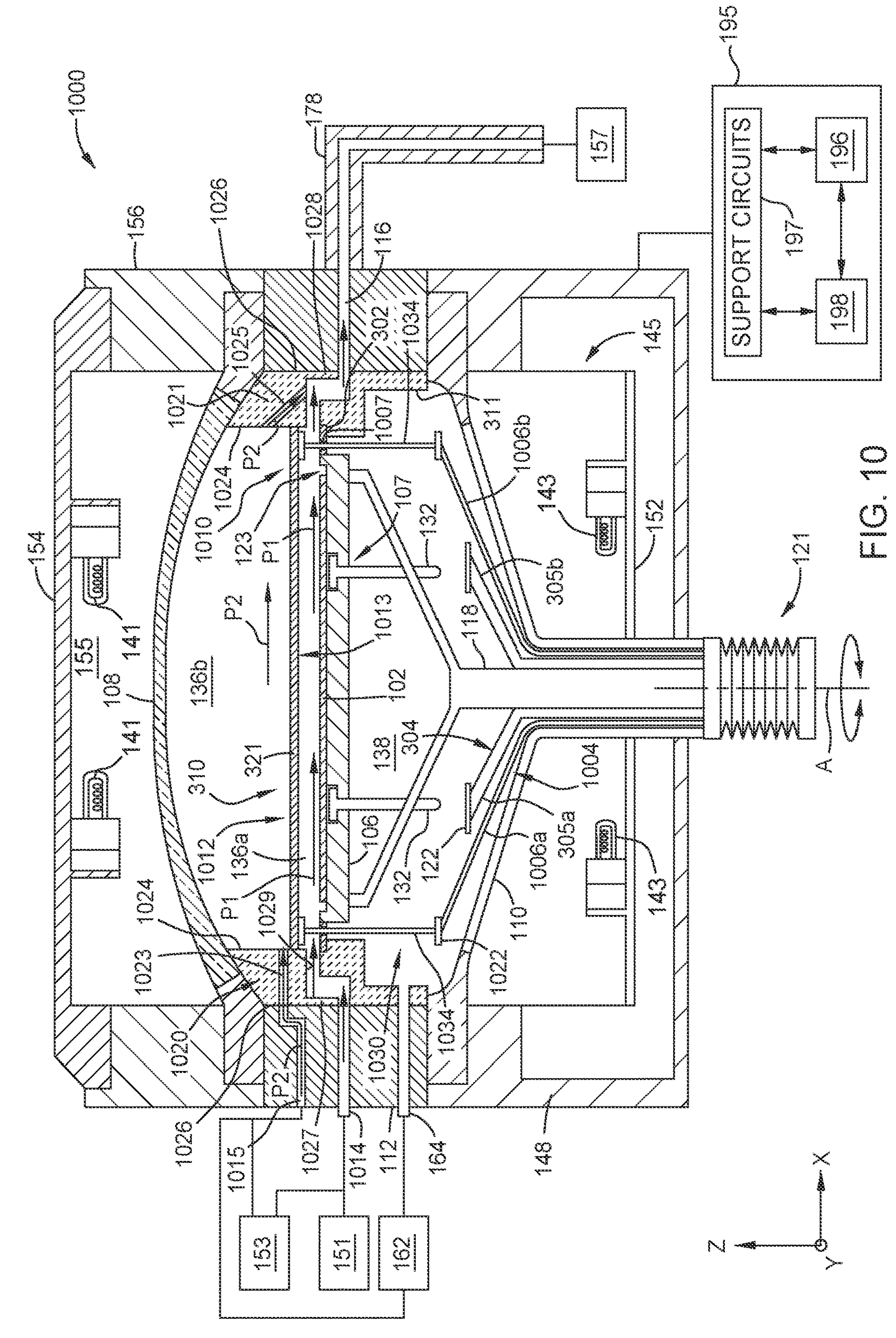
FIG. 10 is a partial schematic side cross-sectional view of a processing chamber with an isolation plate lift assembly in a lowered position, according to one or more embodiments.

FIG. 10 is a partial schematic side cross-sectional view of a processing chamber 1000 with an isolation plate lift assembly 1030 in a lowered position, according to one or more embodiments. The isolation plate lift assembly 1030 includes a second stop 1004 that is capable of raising and lowering. The second stop 1004 includes a plurality of arms 1006*a*, 1006*b* that each include a lift pin stop 1022 on which the isolation plate lift pins 132 can rest when raised and lowered. The substrate support 106 and/or the pre-heat ring 302 may include lift pin holes 1007 disposed therein that receive the isolation plate lift pins 132 therethrough. In one or more embodiments, each of the lift pin holes 1007 is sized to accommodate an isolation plate lift pin 1034 for lifting of the isolation plate 321 before, during, and/or after a deposition process is performed.

In one or more embodiments, as shown in FIG. 10, the second stop 1004 is separate from the stop 304 and the shaft 118. In one or more embodiments, one or more of the second stop 1004 (such as at least a shaft of the second stop 1004), the stop 304 (such as at least a shaft of the stop 304), and/or the shaft 118 are combined to facilitate simultaneous movement of the isolation plate 321 and the substrate 102. This combined configuration may be utilized to maintain a spacing between the isolation plate 321 and the substrate 102 while adjusting (e.g., moving) the cross section of the process gas P1 flow. For example, the location of the cross section of the process gas P1 flow can be moved while maintaining the size of the cross section as substantially constant.

In one or more embodiments, at least one of the lift pin stops 1022 is separate from the other lift pin stops 1022 and/or the other lift pin stops 122. The lift pin stops 1022 may be any regular or irregular shape. In one or more embodiments, the lift pin stops 1022 are a full or partial ring, and/or include a plurality of ring segments. In one or more embodiments, the lift pin stops 1022 include a plurality of plates (such as discs) that are circumferentially spaced from each other. All or some of the lift pin stops 1022 may be connected via the full or partial ring. The full or partial ring of lift pin stops 1022 may be any regular or irregular shape.

In the lowered position of the isolation plate lift assembly 1030, the second stop 1004 is lowered towards the lower window 110 of the processing chamber 1000. The isolation plate lift pins 1034 can rest on the lift pin stops 1022, and the isolation plate 321 rests on the isolation plate lift pins 1034. It is contemplated that the inner surface 1024 may include a ring that the isolation plate 321 may rest upon. In one or more embodiments, the ring of the inner surface 1024 may include lift pin holes 1007. In some embodiments, the isolation plate 321 may rest on the ring, and the isolation plate lift pins 1034 rest within the lift pin holes 1007.

The isolation plate lift pins 1034 can be raised and lowered (using the isolation plate lift assembly 1030) to raise and lower the isolation plate 321. In the lowered position of the isolation plate 321, the volume of the lower portion 136*a* of the processing volume 136 is decreased. With the decreased volume, the velocity of P1 may be increased. Additionally, residual deposition on the inner surface 1024 may be decreased. The amount that the isolation plate 321 is lowered may depend on the processing volume 136, the processing conditions, the desired velocity of P1, and/or experimental data.

Figure 11:
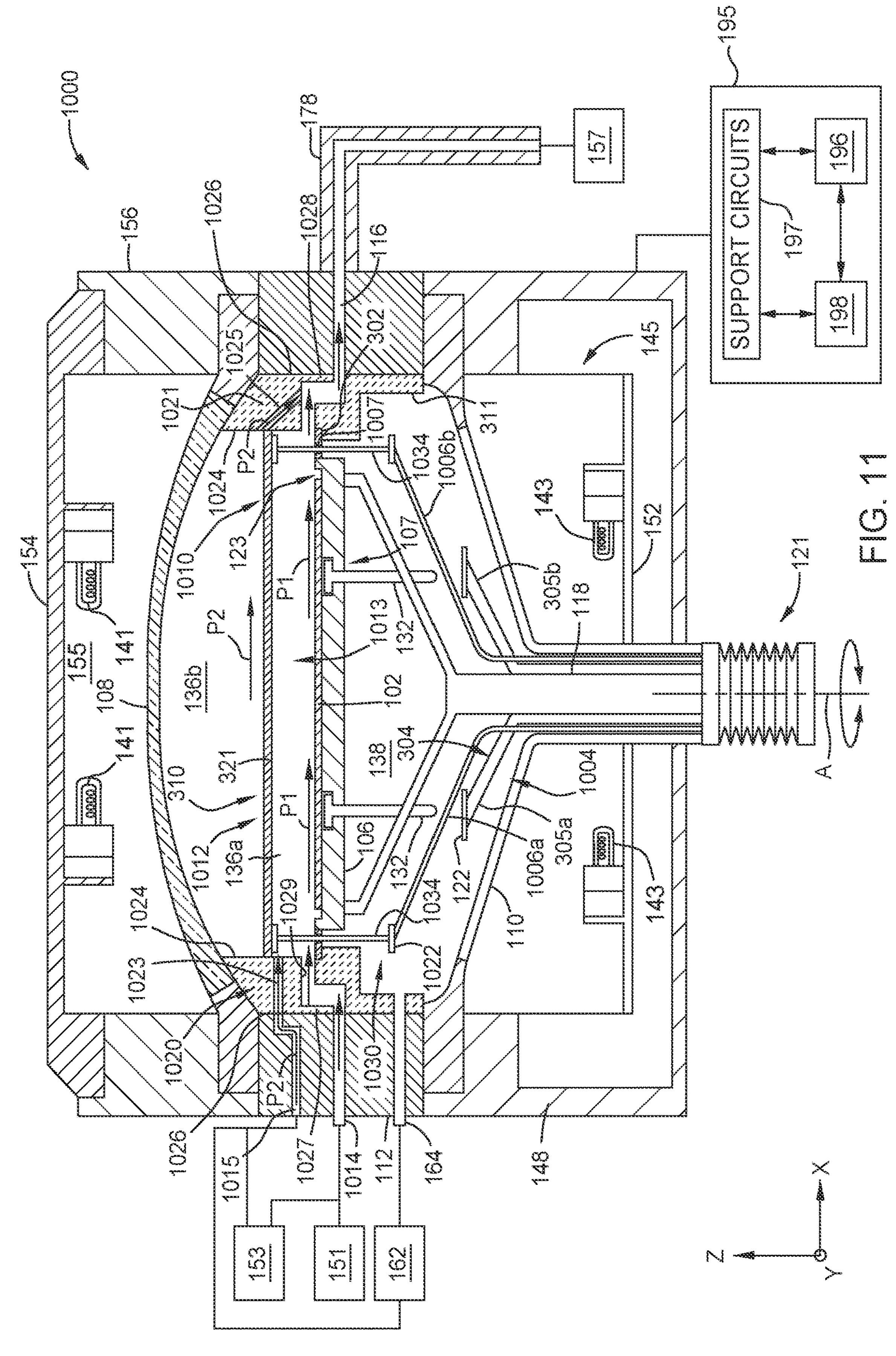
FIG. 11 is a partial schematic side cross-sectional view of a processing chamber with an isolation plate lift assembly in a raised position, according to one or more embodiments.

FIG. 11 is a partial schematic side cross-sectional view of a processing chamber 1000 with the isolation plate lift assembly 1030 in a raised position, according to one or more embodiments. In the raised position of the isolation plate lift assembly 1030, the second stop 1004 is raised away from the lower window 110 of the processing chamber 1000. The isolation plate lift pins 1034 rest on the lift pin stops 1022, and the isolation plate 321 rests on the isolation plate lift pins 1034.

In one or more embodiments, the substrate 102 may be raised or lowered before or after the movement of the isolation plate 321. The substrate 102 may be raised or lowered via the process described above to adjust the gap between the isolation plate 321 and the substrate 102.

In the raised position, the volume of the lower portion 136*a* of the processing volume 136 is increased. With the increased volume, the velocity of P1 may be decreased. The amount by which the isolation plate 321 is raised may depend on the processing volume 136, the processing conditions, the desired velocity of P1, and/or experimental data.

In one or more embodiments, the substrate support 106 and the shaft 118 may be lowered prior to the placement of a substrate 102 within the processing chamber 1000. The substrate 102 may be placed into the lower portion 136*a* of the processing volume 136 and onto the lift pins 132 while the lift pins 132 are in a raised position. The lift pins 132 may then be lowered to lower the substrate 102 onto the substrate support 106. After placement of the substrate 102 onto the substrate support 106, the isolation plate lift pins 1034 may be lowered to lower the isolation plate 321 to the desired placement for processing the substrate 102.

When the isolation plate lift assembly 1030 is lowered by a certain amount below the lowered position shown in FIG. 10, the isolation plate 321 can rest on one or more inner ledges of the upper liner 1020, the isolation plate lift pins 1034 can be suspended from the substrate support 106 and/or the pre-heat ring 302 (as shown for the lift pins 132 in FIG. 10), and/or the lift pin stops 1022 can disengage from the isolation plate lift pins 1034. From such a disengaged position, the isolation plate lift assembly 1030 can be raised such that the isolation plate lift pins 1034 can rest on the lift pin stops 1022, and the isolation plate 321 can rest on the isolation plate lift pins 1034 when the isolation plate lift pins 1034 engage and raise the isolation plate 321.

Figure 12:
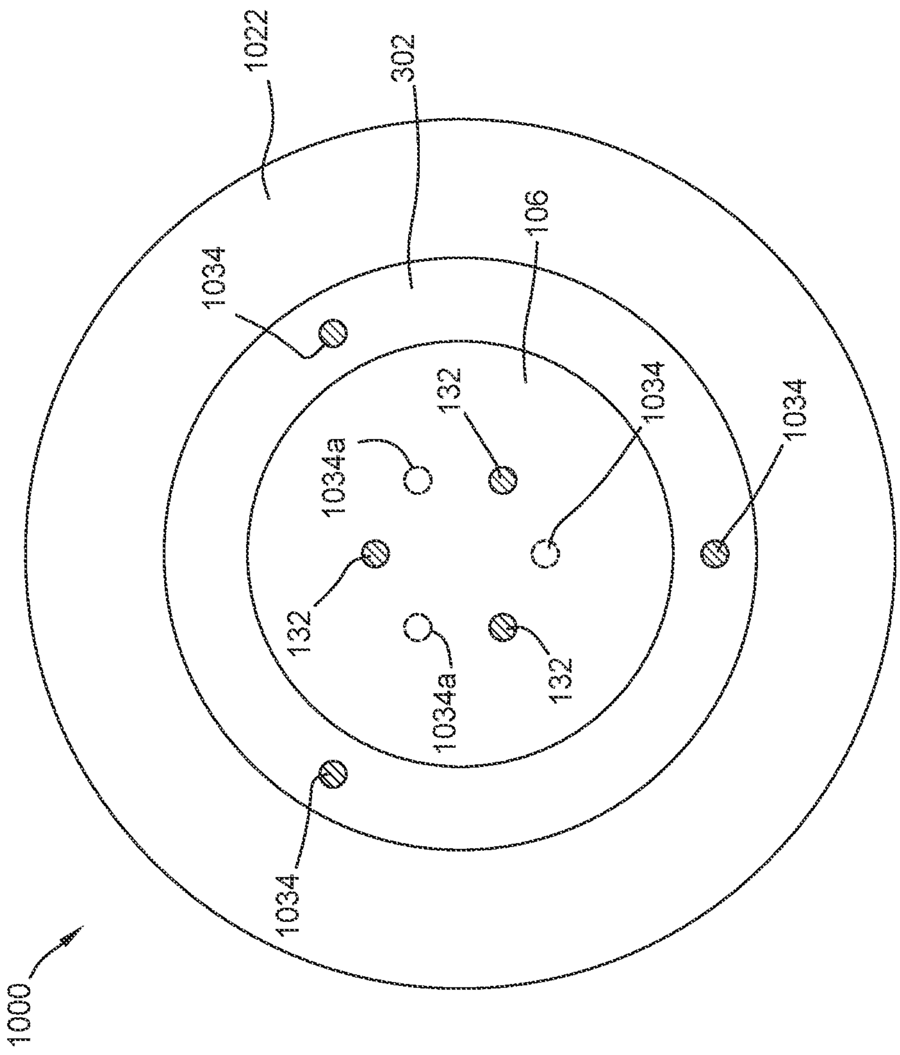
FIG. 12 is a partial schematic top-down view of a processing chamber with an isolation plate lift assembly, according to one or more embodiments.

FIG. 12 is a partial schematic top-down view of a processing chamber 1000 with the isolation plate lift assembly 1030, according to one or more embodiments. The lift pins 132 are located within an outer circumference of the substrate support 106. The isolation plate lift pins 1034 are located within an outer circumference of the pre-heat ring 302, but outside of the outer circumference of the substrate support 106 (as is shown in FIGS. 10 and 11).

It is contemplated that the isolation plate lift pins 1034 may be located (as shown by ghost positions 1034A) within the circumference of the substrate support 106 and at substantially the same radial location of the lift pins 132. In one or more embodiments, when the substrate 102 has been removed from the processing chamber 1000, the lift pins 132 may be utilized to lift the isolation plate 321. In such an embodiment, the 1004 can be omitted, and the 138 can be rotated (e.g., by about 180 degrees) to move out from under the lift pins 132 and align under the isolation plate lift pins 1034 at the ghost positions 1034*a*.

Three lift pins 132 and three isolation plate lift pins 1034 are shown in FIG. 12. It is contemplated that more or fewer lift pins 132 and/or isolation plate lift pins 1034 may be utilized.

In FIG. 12, the lift pins 132 and the isolation plate lift pins 1034 are shown as circumferentially unaligned in solid. It is contemplated that the lift pins 132 and the isolation plate lift pins 1034 (when at the ghost positions 1034*a*) may be circumferentially aligned. Additionally, the lift pins 132 and the isolation plate lift pins 1034 are shown to be evenly spaced form each other in FIG. 12. It is contemplated that the lift pins 132 and/or the isolation plate lift pins 1034 may be unevenly spaced from each other.

Subject matter of the present disclosure can be expressed in the following example: a processing chamber for use in semiconductor manufacturing, comprising: one or more lift pin stops coupled to one or more arms, the one or more arms each having a lift pin stop at a distal end thereof, wherein the one or more lift pin stops are configured to move vertically; one or more isolation plate lift pins, each of the one or more isolation plate lift pins configured to contact the one or more lift pin stops; and an isolation plate, the one or more isolation plate lift pins configured to contact the isolation plate, wherein vertical movement of the one or more lift pin stops results in vertical movement of the isolation plate.

Benefits of the present disclosure include enhanced deposition thicknesses; enhanced deposition uniformities; reduced coating of chamber components (such as the isolation plate 321); adjustability of process parameters (such gas flow rate, temperature, and/or growth rate); reduced cleaning; increased throughput and efficiency; and reduced chamber downtime.

It is contemplated that one or more aspects disclosed herein may be combined. As an example, one or more aspects, features, components, operations and/or properties of the processing chamber 1000, the flow guide insert 310, the pivot shaft 570, the adjustment mechanism 500B, the actuator 671, the actuator 771, the isolation plate 821*a*, the curved isolation plate 821*b*, the method 900, and/or the isolation plate lift assembly 1030 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

The invention claimed is:

1. A flow guide applicable for use in semiconductor manufacturing, the flow guide comprising:
an isolation plate;
a mechanical actuator; and
an adjustment mechanism coupled to the mechanical actuator, the adjustment mechanism comprising:
a plurality of lift pin stops, each lift pin stop including an arm coupled to the actuation mechanism; and
a plurality of lift pins disposed on the lift pin stops, wherein the plurality of lift pins are configured to support the isolation plate.

2. A substrate processing chamber, comprising:
a body at least partially defining an internal volume;
a substrate support disposed within the internal volume;
the flow guide of claim 1 positioned in the internal volume above the substrate support; and
an inlet opening configured to flow a gas into the internal volume between the substrate support and the isolation plate of the flow guide.

3. A processing chamber, comprising:
a body at least partially defining an internal volume;
a substrate support disposed within the internal volume; and
a flow guide comprising:
an isolation plate;
a mechanical actuator; and
an adjustment mechanism coupled to the mechanical actuator, the adjustment mechanism configured to induce an angular movement in the isolation plate, the adjustment mechanism comprising:
a plurality of lift pin stops, each lift pin stop including an arm coupled to the actuation mechanism; and
a plurality of lift pins disposed on the lift pin stops, wherein the plurality of lift pins are configured to support the isolation plate.

4. The processing chamber of claim 3, further comprising an inlet opening configured to flow a gas into the internal volume between the substrate support and the isolation plate of the flow guide.

5. A processing chamber, comprising:
a body at least partially defining an internal volume;
a substrate support disposed within the internal volume; and
a flow guide comprising:
an isolation plate;
a first parallel block coupled to a lower surface of the isolation plate;
a second parallel block coupled to a lower surface of the isolation plate, the second parallel block disposed opposite to the first parallel block;
a mechanical actuator; and
an adjustment mechanism coupled to the mechanical actuator, the adjustment mechanism configured to induce an angular movement in the isolation plate, the adjustment mechanism comprising:
a plurality of lift pin stops, each lift pin stop including an arm coupled to the actuation mechanism; and
a plurality of lift pins disposed on the lift pin stops, wherein the plurality of lift pins are configured to support the isolation plate.

* * * * *